(12) United States Patent
Dygert et al.

(10) Patent No.: US 8,422,692 B1
(45) Date of Patent: *Apr. 16, 2013

(54) AUDIO DISTRIBUTION SYSTEM

(75) Inventors: Timothy W. Dygert, Indianapolis, IN (US); James Suchora, New Port Richey, FL (US); Jason Dunaway, Nashville, TN (US); Robert P. Farinelli, Jr., Lexington, KY (US)

(73) Assignee: Core Brands, LLC, Petalluma, CA (US)

( * ) Notice: Subject to any disclaimer, the term of this patent is extended or adjusted under 35 U.S.C. 154(b) by 1749 days.

This patent is subject to a terminal disclaimer.

(21) Appl. No.: 11/716,402

(22) Filed: Mar. 9, 2007

(51) Int. Cl.
- *H04B 3/00* (2006.01)
- *H04R 27/00* (2006.01)
- *H03G 3/00* (2006.01)

(52) U.S. Cl.
USPC ............. 381/77; 381/80; 381/82; 381/104; 381/105; 381/107

(58) Field of Classification Search .............. 381/77–79, 381/58–59, 80, 82, 85, 104, 105, 107
See application file for complete search history.

(56) References Cited

U.S. PATENT DOCUMENTS

| | | | |
|---|---|---|---|
| 4,238,724 A | 12/1980 | Klaus et al. | |
| 4,775,766 A | 10/1988 | Kooy et al. | |
| 5,131,048 A | 7/1992 | Farenelli et al. | |
| 5,289,110 A * | 2/1994 | Slevinsky | 323/301 |
| 5,577,128 A | 11/1996 | Farinelli, Jr. | |
| 5,761,320 A | 6/1998 | Farinelli et al. | |
| 6,389,139 B1 | 5/2002 | Curtis et al. | |
| 7,023,778 B2 * | 4/2006 | Takashima | 369/53.18 |
| 7,031,476 B1 * | 4/2006 | Chrisop et al. | 381/77 |
| 2004/0213422 A1 * | 10/2004 | Arcaria | 381/111 |

* cited by examiner

*Primary Examiner* — Duc Nguyen
*Assistant Examiner* — George Monikang
(74) *Attorney, Agent, or Firm* — Crawford Maunu PLLC (57) ABSTRACT

Speaker control systems are implemented using a variety of systems and methods. In one such system, an audio signal is distributed to at least one speaker selected from a set of speakers. The system includes a set of audio-distribution circuits for distributing the audio signal to the set of speakers. Logic circuitry is used to automatically determine an impedance-based parameter for use in distributing the audio signal to the at least one selected speaker based at least partly on a load-tolerance parameter for an audio source and on an impedance of the at least one selected speaker. The logic circuitry controls distribution of the audio signal to the selected speakers based at least partly on the impedance-based parameter. One or more of the set of audio-distribution circuits are used by the logic circuitry to distribute the audio signal to the at least one selected speaker.

25 Claims, 4 Drawing Sheets

AUDIO DISTRIBUTION SYSTEM

FIELD OF THE INVENTION

The present invention relates generally to audio speaker systems and more particularly to controlling distribution of audio to selected speakers in an audio speaker system.

BACKGROUND

In many applications today it is desirable to use an audio amplifier to drive multiple loudspeakers. For example, home systems, auditoriums, sports arenas, concert halls and theaters are some of the situations in which multiple speakers are used.

Another application in which it would be advantageous to connect multiple speakers to a single amplifier is at an outdoor concert. People are often far away from the stage and would be unable to hear the music without additional speakers located throughout the venue. One way in which to connect all of these speakers to a single amplifier channel is to connect them in parallel. The speakers can be connected to an amplifier output in this manner as long as their combined load impedance does not fall beneath the amplifier's required minimum load impedance. However, an amplifier's minimum load impedance is typically 4 or 8 ohms and modern speakers are also commonly made in a 4 or an 8 ohm version which means that a very limited number of speakers can be connected in parallel which would not be useful for an outdoor concert.

Another way in which to connect multiple speakers for an outdoor concert would be to place a high-power resistor (a 3-Ohm 50 W resister is used as an example) in series with the amplifier output and then attach parallel speakers. However, this type of connection is very inefficient; most of the amplifier power goes towards heating the high-power series resistor instead of powering the speakers. This method also would not be advantageous for an outdoor concert because only a small number of speakers could be connected in this manner.

It is desirable to be able to individually control the volume of each of the speakers connected to a single audio amplifier channel and to be able to turn each speaker on and off independently. For example, homes often have speakers located in multiple rooms throughout the house that are driven and controlled from a central location using a single audio amplifier. The volume level of the speakers in one room may need to be set at a different level than the volume of the speakers in another room, or even speakers in the same room may need to be at different volumes. For example, if a person is having a party, the volume of the speakers located in the dining room could be set at a lower volume level than the speakers on the patio. Whereas, later in the evening the speakers on the patio may need to be turned down or even off to avoid upsetting the neighbors.

One way in which to connect multiple speakers to a single amplifier that allows for individual control of the speakers is by impedance matching through the use of variable autoformers (commonly called a volume control in the audio industry). By properly selecting the turns ratio of the autoformers, the attached speakers can present an optimal reflected impedance to the amplifier. However, to insure the impedance presented to the amplifier does not drop below the minimum impedance of the amplifier, the turns ratio of the autoformers must always be set for a worst case scenario. For example, if eight, 8 ohm loudspeakers are connected to an amplifier channel through autoformers, then each speaker can only access ⅛ of the amplifier channel output power regardless of how many of the speakers are turned on. This means that the amount of power that is used to drive each speaker cannot be individually controlled. For example, if the speakers in one room of a house are turned off, then the power that was being used to drive them cannot be reallocated to the remaining speakers.

The above issues as well as others have presented challenges to connecting multiple loudspeakers to a single audio amplifier channel for a variety of applications.

SUMMARY

The present invention is directed to overcoming the above-mentioned challenges and others related to the types of devices discussed above and in other implementations. The present invention is exemplified in a number of implementations and applications, some of which are summarized below.

According to an example embodiment, the present invention is directed to a speaker control system that distributes an audio signal to speakers selected from a set of speakers. The signal is distributed for reallocation of power and/or automated optimization. By reallocating the power based on speakers actually selected from a set of speakers (e.g., as opposed to designing the system for worst-case scenarios), significant advantages can be realized in connection with distribution and use of the audio signal.

In another aspect, a speaker control system distributes an audio signal to at least one speaker selected from a set of speakers. The system includes a set of audio-distribution circuits for distributing the audio signal to the set of speakers. Logic circuitry is used to automatically determine an impedance-based parameter for use in distributing the audio signal to the at least one selected speaker based at least partly on a load-tolerance parameter for an audio source and on an impedance of the at least one selected speaker. The logic circuitry controls distribution of the audio signal to the selected speakers based at least partly on the impedance-based parameter. One or more of the set of audio-distribution circuits are used by the logic circuitry to distribute the audio signal to the at least one selected speaker.

According to another example embodiment of the present invention, a speaker control distributes an audio signal to at least one speaker selected from a set of speakers. The system includes at least one user input indicative of the selection of the at least one speaker from the set and at least one user volume input indicative of an adjustable volume level. The system has a set of audio-distribution circuits, including a selectable-tap transformer for each speaker of the set. Logic circuitry is used to automatically determine an impedance-based parameter for use in distributing the audio signal to the at least one selected speaker based at least partly on a load-tolerance parameter for an audio source and on an impedance of the at least one selected speaker. The logic circuitry controls distribution of the audio signal to the at least one selected speaker by automatically selecting a tap setting of one or more of the transformers based at least partly on the user volume input and the impedance-based parameter.

The above summary of the present invention is not intended to describe each illustrated embodiment or every implementation of the present invention. The figures and detailed description that follow more particularly exemplify these embodiments.

BRIEF DESCRIPTION OF THE FIGURES

The invention may be more completely understood in consideration of the detailed description of various embodiments of the invention that follows in connection with the accompanying drawings, in which.

While the invention is amenable to various modifications and alternative forms, various embodiments have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of audio distribution environments where it is desirable to drive certain speakers selected from a set of speakers connected to a single audio amplifier. Aspects of the invention have been found to be particularly suited for distributing an audio signal to a set of speakers connected to a single audio amplifier channel without dropping below the target impedance load for the amplifier. Other aspects of the invention have been found to be particularly suited for maximizing use of the audio signal, e.g., by reallocation of power and/or automated optimization. While the present invention is not necessarily limited to such applications, various aspects of the invention may be appreciated through a discussion of examples using this context.

According to an example embodiment of the present invention, a speaker control system distributes an audio signal to the selected speakers from a set of speakers that are connected to a single audio amplifier channel. For example, in a home audio environment a person is listening to music on speakers located in multiple rooms throughout the house. The person can individually choose the speakers that play the music. When a speaker is turned on or off, the system adjusts the perceived impedance of the selected speakers such that their total impedance load does not drop below the target impedance load of the audio amplifier. The system reallocates the amplifier's power such that all of the power is available to drive the selected speakers; the system also maintains the current volume level of the selected speakers. For example, if four speakers were playing music and the user turns off two of the speakers, then the system reallocates the amplifier's power making all the power available to drive the remaining two speakers.

As used herein, a speaker or speaker channel may include one or more speakers that can be selected by a user. For example, some speaker boxes include several speakers capable of generating different frequencies of sounds (e.g., woofers, mid-ranges and tweeters). One such speaker box is the commercially available ELAN M Series™ speakers provided by ELAN Home Systems, LLC. In some applications, multiple boxes can be connected to the same speaker channel (e.g., left, right and surround speakers). Each speaker channel can be selected by a user of the system. In this sense, a speaker channel can be distinguishable from an amplifier channel because an amplifier channel may provide an audio signal to any number of selectable speaker channels. For simplicity, a speaker, as used herein and unless otherwise indicated, represents a speaker channel that can include one or more individual speakers.

In another example embodiment, a user selects which of the speakers from the set of speakers should receive the audio from the amplifier. In response to the user's selection of speakers, logic circuitry is used to automatically determine an impedance-based parameter which is used to control distribution of the audio to the selected speakers. The impedance-based parameter is also determined based upon a target load impedance for the amplifier and the impedance of each of the selected speakers. In one implementation, the target load impedance is the minimum load impedance of the amplifier. In another implementation, the target load impedance for the amplifier and the impedance of each of the speakers connected to the system are provided by the user during the setup of the system. The selected speakers will appear to the amplifier as a load approximately equal to the target load impedance for the amplifier. Audio-distribution circuitry is used to distribute the audio to each of the selected speakers.

In a further example embodiment, the audio-distribution circuitry includes a selectable-tap transformer, also called an autotransformer or an autoformer. The logic circuitry controls distribution of the audio by automatically selecting a tap on the selectable-tap transformer based at least partly on the impedance-based parameter. In order to create a fixed impedance match, a transformer has a number of windings. In the present invention, the windings of the transformer necessary to create a fixed impedance match can be removed because they are no longer necessary, which allows the wire size on the autotransformers to be increased. This is particularly useful for increasing the efficiency of the autotransformers. In a specific implementation, the autotransformers are housed in a single enclosure and their tap settings are under control of a microprocessor. In another implementation, the autotransformers are located with the speakers.

Figure 1:
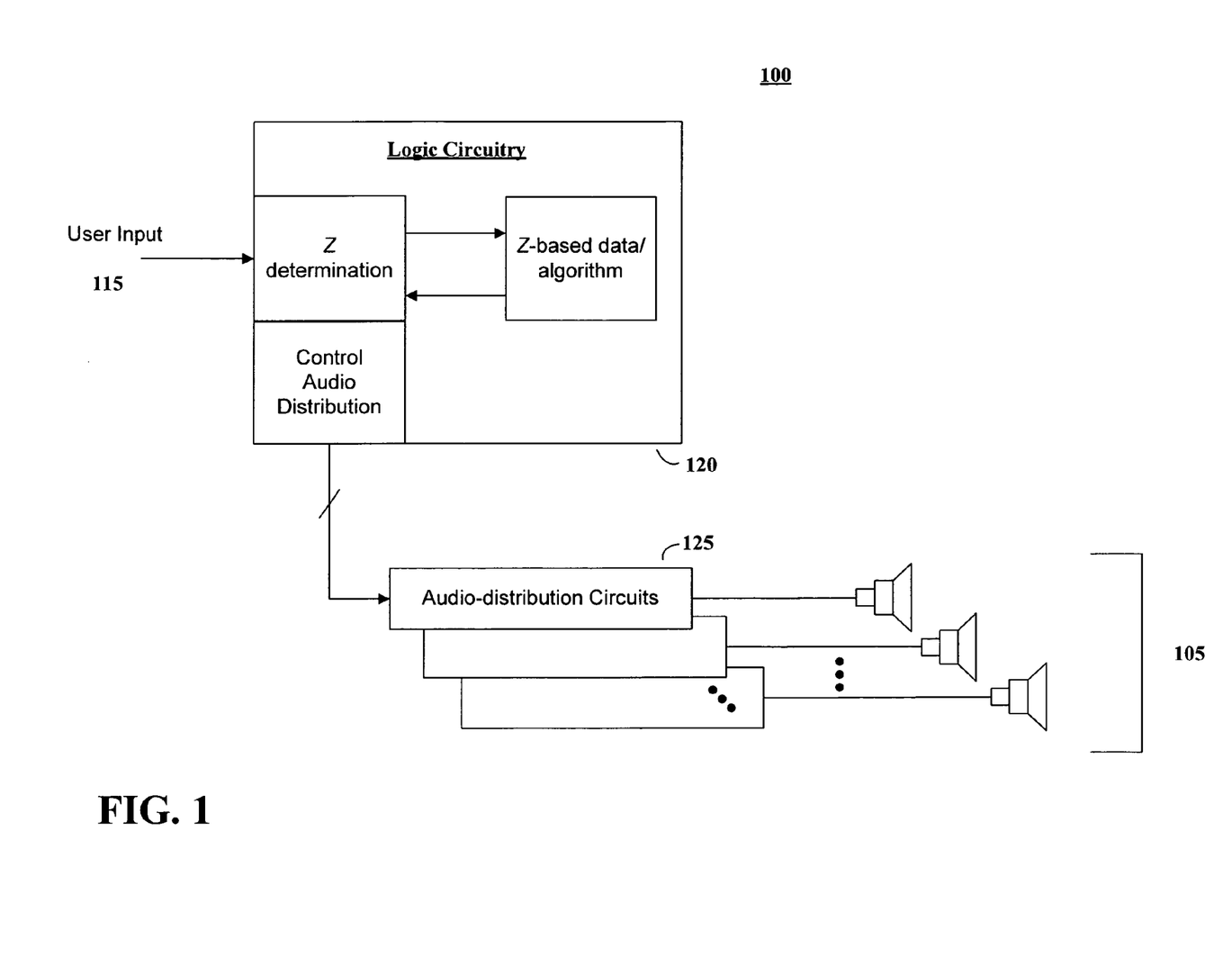
FIG. 1 is a block diagram of a speaker control system according to one embodiment of the present invention.

FIG. 1 is a block diagram of a speaker control system according to an example embodiment of the present invention. The speaker control system 100 distributes audio to the speakers 105 selected by the user. In response to a user input 115 indicative of the selection of at least one speaker, logic circuitry 120 determines an impedance-based parameter Z based upon the user input, the target load impedance for the amplifier and the load impedance of each selected speaker. The logic circuitry described in the various embodiments of the present invention can include discrete logic, programmable logic, a special purpose processor, a general purpose processor with specialized software, or any other suitable arrangement. In one implementation, the logic circuitry 120 determines the impedance-based parameter (represented as the symbol "Z") by accessing a look-up-table "LUT" (not shown in FIG. 1). A LUT is useful when there is enough memory available to store the possible combinations of selected speakers and target impedances. In some instances using a LUT with a general purpose processor can be faster than calculating Z, but it is not as accurate. In another implementation, Z is calculated by the logic circuitry 120 using an algorithm. Using an algorithm with a DSP (such as Texas Instruments TMS320) to calculate Z is more accurate than using a LUT but in some instances not as fast. The algorithm is also capable of adapting to several possible selected speaker impedances and target impedance load (i.e., not just those programmed into a LUT). The logic circuitry 120 uses audio-distribution circuits 125 to control distribution of the audio to the user selected speakers. In one implementation, the audio-distribution circuits 125 include an autotransformer. The logic circuitry 120 uses Z to select a tap setting for each autotransformer associated with the user selected speakers such that the load perceived by the amplifier does not drop below the target load impedance for the amplifier.

According to a specific embodiment of the present invention, the selection of a tap setting for each autotransformer involves setting a maximum tap setting for the selected speakers. This allows the user to vary the volume of each of the selected speakers up to the maximum tap setting. In one instance, the user setting for each selected speaker will function the same up until the maximum tap setting is reached. For instance, a speaker may have user settings (volume) from 1 to 10 and (actual) tap setting from 1 to 10. A user-volume setting of 3 results in a tap setting of 3 (and produces the same amount of sound) regardless of the maximum tap setting, so long as the maximum tap setting is 3 or higher. In another instance, the correspondence between the user settings and the actual tap setting can be scaled in accordance with the maximum tap setting. If the maximum tap setting is 10, the user setting directly corresponds to the tap settings (e.g., user setting of 6 results in a tap setting of 6). If, however, the maximum tap setting is 5, the user settings are scaled such that a user setting of 10 corresponds to a tap setting of 5 and a user setting of 6 correspond to a tap setting of 3. Since a change in the tap setting would cause a change in current volume level, the system may be configured to make a corresponding adjustment so that the volume level of the music heard by the user remains the same as before.

In one embodiment of the present invention, the audio distribution circuits can be located at each corresponding speaker. In one such instance, the audio distribution circuits can be implemented with two inputs. The first input can be used to control the volume limit of the speaker (and the corresponding tap setting). The second input can be used to adjust the actual volume level within the volume limit. For example, the volume limit could correspond to tap setting 4 and the volume could then be adjusted between settings 1 to 4.

Figure 2:
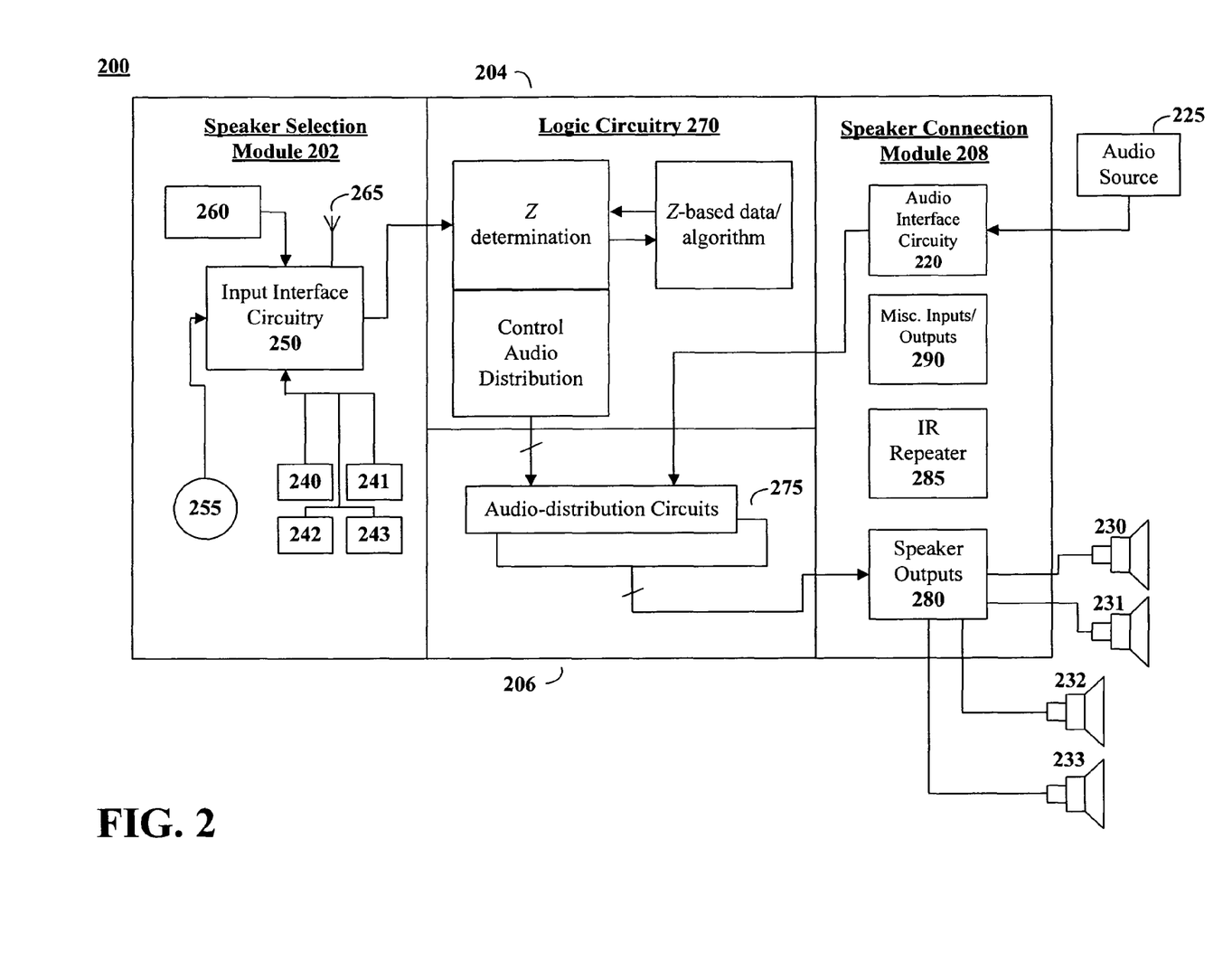
FIG. 2 is another block diagram of a speaker control system, according to one embodiment of the present invention, showing certain modules of the system from both electrical and mechanical perspectives.

FIG. 2 is another block diagram of a speaker control system, according to an example embodiment of the present invention, showing certain modules of the system from both electrical and mechanical perspectives. The speaker control system 200 is divided into four modules; specifically, speaker selection module 202, impedance determination module 204, audio-distribution module 206 and speaker connection module 208. The speaker connection module 208 has audio interface circuitry 220 for receiving audio from an audio source 225. In one implementation, audio source 225 is an audio amplifier and audio interface circuitry 220 receives a speaker level input. In another implementation, audio interface circuitry 220 includes an amplifier and an RCA input, an optical input or other such type of input for receiving an audio signal from audio source 225.

The system 200 distributes the audio to a set of speakers 230-233 based upon various parameters, e.g., the speakers selected from the set, the impedance of each selected speaker and the target impedance load for the audio source 225. In one implementation, the speaker selection module includes speaker selection inputs 240-243 that are connected to input interface circuitry 250 and which can be used to indicate the selected speakers. The speaker selection module 202 can also indicate a volume change in one of the selected speakers. In one implementation, speaker selection module 202 has a volume control input 255 that is connected to the input interface circuitry 250 and which can be used to indicate a volume change. In another implementation, the speaker selection module 202 has an IR interface circuitry 260 that is connected to the input interface circuitry 250. For example, IR interface circuitry 260 can receive an IR signal from a remote control which can be used to select the speakers that are to receive audio and to control their volume. In further implementation, the speaker selection module 202 also has an RF antenna input 265 that is connected to the input interface circuitry 250; the RF antenna can receive an input signal which can be used to select the speakers that are to receive audio and to control their volume. Since a change in the tap setting would cause current volume level heard to change, the system may be configured to make a corresponding adjustment so that the volume level of the music heard by the user remains the same as before.

In one example, speakers 230 and 231 are selected by speaker selection inputs 240 and 241 respectively. The input interface circuitry 250 is connected to logic circuitry 270 of impedance determination module 204, which is used to determine Z for each selected speaker 230 and 231 based upon the target load impedance for the audio source 225 and the impedance of the selected speakers. In one implementation, the logic circuitry 270 determines Z by accessing a look-up-table. In another implementation, Z is calculated by the logic circuitry 265 using an algorithm. The logic circuitry 270 is connected to audio-distribution circuits 275 of audio-distribution module 206. The logic circuitry controls distribution of the audio to the selected speakers 230 and 231 by using the audio distribution circuits 275 based at least partly on Z. The audio-distribution module 206 has one audio-distribution circuit for a fixed number of speakers. In this example there is one audio-distribution circuit for each pair of speakers that are connected to the speaker control system 200. The audio-distribution circuits 275 are connected to speaker outputs 280 of speaker connection module 208. In one implementation, speaker connection module 208 includes an infrared (IR) repeater 285. Although not shown in FIG. 2, the IR repeater 285 is connected to the input interface circuitry 250. The IR repeater 285 can be used to relay infrared signals from other locations, thereby either selecting the speakers that are to receive audio and to control their volume, or controlling other devices that might be co-located with the speaker control system 200 such as audio source 225. In another implementation, speaker connection module 208 also includes miscellaneous other inputs and outputs 290.

The example embodiment of FIG. 2 is shown with a set of four speakers 230-233 connected to the speaker control system 200; however, the present invention is not so limited. Any number of speaker sets can be connected to the speaker control system.

In one example embodiment, the speaker control system is connected to a set of N speakers. The speaker selection module 202 has N speaker selection inputs and the speaker connection module 208 has N speaker outputs. The audio-distribution module 206 has a corresponding number of audio-distribution circuits 275 to accommodate the N speakers. The impedance determination module 204 can be the same regardless of the number of speakers that the speaker control system is designed to accommodate.

In another example embodiment, the autotransformers are under the control of logic-circuitry which determines what load the autotransformers/loudspeakers present to the amplifier. In response to the number of speakers selected by the user, the logic circuitry selects an impedance-based parameter from a look-up table. The logic-circuitry then selects the tap settings of the autotransformers based upon the impedance-based parameter, which allows the impedance match settings to be optimized for optimum power transfer from the amplifier to the selected speakers.

In a specific implementation, eight, 8 ohm speakers are connected to the system and the target load impedance is 8 ohms. If only one speaker is selected by the user, the turns ratio would be set to a max of 1:1 so that at full volume, the load reflected to the amplifier would be 8 ohms. The selected speaker will be supplied with 100% of the amplifier's power. When all 8 speakers are selected by the user, the turns ratio for each autotransformer would be set to 2.82:1 yielding an approximate 8× impedance match. Each speaker would provide an apparent line termination of approximately 64 ohms for the amplifier channel, and each speaker would access ⅛ of the amplifier's power. If only two speakers were selected, then each would have access to 50% of the amplifier's power, if four speakers were selected, then each would have access to 25% of the amplifier's power, etc.

An example of a look-up table that is used to determine an impedance-based parameter according to an example embodiment of the present invention is depicted below in Table 1.

TABLE 1

| | | Autotransformer Load Ohms X | | | | |
|---|---|---|---|---|---|---|
| | Turns | 8 Ohm Speaker | | 4 Ohm Speaker | | |
| Level | Ratio | X | | 1/X | X | | 1/X |
|---|---|---|---|---|---|---|---|
| 12 | 1 | 8 | ohm | 0.125 | 4 | ohm | 0.25 |
| 11 | 0.868421053 | 11 | ohm | 0.090909091 | 5 | ohm | 0.2 |
| 10 | 0.613157895 | 21 | ohm | 0.047619048 | 11 | ohm | 0.090909091 |
| 9 | 0.431578947 | 43 | ohm | 0.023255814 | 21 | ohm | 0.047619048 |
| 8 | 0.276315789 | 105 | ohm | 0.00952381 | 52 | ohm | 0.019230769 |
| 7 | 0.173684211 | 265 | ohm | 0.003773585 | 133 | ohm | 0.007518797 |
| 6 | 0.097368421 | 844 | ohm | 0.001184834 | 422 | ohm | 0.002369668 |
| 5 | 0.052631579 | 2888 | ohm | 0.00034626 | 1444 | ohm | 0.000692521 |
| 4 | 0.031578947 | 8022 | ohm | 0.000124657 | 4011 | ohm | 0.000249314 |
| 3 | 0.015789474 | 32089 | ohm | 3.11633E−05 | 16044 | ohm | 6.23286E−05 |
| 2 | 0.007894737 | 128356 | ohm | 7.79083E−06 | 64178 | ohm | 1.55817E−05 |
| 1 | 0.002631579 | 1155200 | ohm | 8.65651E−07 | 577600 | ohm | 1.7313E−06 |

X is the impedance perceived by the amplifier of each speaker connected to an autotransformer which corresponds to a given turns ratio and a certain level (or tap setting) of the autotransformer. Where X is determined by the following equation:

$$X = 1/((\text{turns ratio}^2)/\text{speaker ohms})$$

The total impedance load of the user selected speakers appears to the amplifier as a load approximately equal to the target load impedance for the amplifier. Logic circuitry selects an impedance-based parameter from the look-up table which corresponds to an allowed level for each selected speaker. The impedance-based parameter is used to select the tap settings of each autotransformer given the target impedance for the amplifier $A_L$ and the impedance of each selected speaker such that the following relationship is satisfied.

$$1/A_L \geq 1/X_1 + 1/X_2 + 1/X_3 + \ldots + 1/X_x$$

Where $X_1$ through $X_x$ are the impedances perceived by the amplifier for each selected speaker. For an amplifier with minimum impedance load of 8 ohms (the target impedance load) and using the relationship above, the maximum perceived load is ⅛ or 0.125. Referring to Table 1, when one 8 ohm speaker is selected by the user, an allowable tap setting is chosen which does not exceed 0.125 by using column 1/X; therefore, any level can be selected from the table because the amplifier would always perceive an impedance load of 8 ohms or greater. Level 12 represents a situation when the impedance of the selected speaker is equal to the target impedance load for the amplifier. In this situation there is no need to select a tap setting of the transformer to match the impedance of the speaker with the target impedance for the amplifier. The speaker can be directly connected to the amplifier. Therefore, level 12 does not represent an actual tap setting of the transformer. Referring again to Table 1, when one 4 ohm speaker is selected by the user, level 10 or any level below can be selected and the amplifier perceives a load of at least 11 ohms. Table 1 can be expanded to include all possible combinations of target amplifier loads, speaker impedance loads, and number of selected speakers.

In a further example embodiment, a programmable processor uses an algorithm to automatically determine an impedance-based parameter. The processor distributes the available power of a given amplifier channel to the selected speakers without dipping below the target impedance for the amplifier. Each of the speakers that are connected to the amplifier is placed on a volume control (e.g., an autotransformer). The processor uses the algorithm to determine the impedance-based parameter based on the number of speakers that are selected by the user the target impedance load for the amplifier and the impedance of each selected speaker. In one implementation, the algorithm uses the following equation to determine an impedance-based parameter for each of the selected speakers, where $A_L$ is the impedance load on the amplifier and $R_1$ through $R_x$ are the impedances of the selected speakers.

$$1/A_L = 1/R_1 + 1/R_2 + 1/R_3 + \ldots + 1/R_x$$

The processor then uses the impedance-based parameter to determine the corresponding transformer tap setting of each of the autotransformers that allows the amplifier's power to be distributed to each selected speaker. Referring to the equation above, the use of autotransformers allows the impedance load perceived by the amplifier $A_L$ from the selected speaker loads $R_1$ through $R_x$ to be greater than or equal to the target impedance for a given amplifier.

By placing speaker loads on volume controls (i.e., autotransformers), several speaker loads can be attached to one amplifier channel because the volume controls act as impedance multipliers. If an 8 ohm speaker has its volume control turned to full ON (position 12), the load presented to the amplifier is 8 ohms; a 1:1 turns ratio resulting in a 1:1 impedance transfer. If the same volume control is turned down one position (position 11 or transformer tap 11), the turns ratio becomes 1.414:1. The impedance transfer varies with the turns ratio squared, so an approximate 1:2 impedance transfer is produced. This means that the amplifier now sees an impedance of 16 ohms (2×8 ohms). Two volume controls with 8 ohm loads could be safely attached to an 8 ohm amplifier, assuming that both volume controls would not be turned higher than the 1:2 impedance tap. Likewise, four volume controls with 8 ohm loads could be safely attached to an 8 ohm amplifier, assuming that all 4 volume controls would not be turned higher than the 1:4 impedance tap (position 10). Eight volume controls with 8 ohm loads could be safely attached to an 8 ohm amplifier, assuming that all 8 volume controls would not be turned higher than the 1:8 impedance tap (position 9).

In another embodiment of the present invention, the speaker volumes are controlled by adjusting the tap settings of the transformers. The logic circuitry determines an impedance-based parameter based on the tap settings corresponding to the current volume for each selected speaker. A tap setting limit of each transformer is determined from the current tap settings of the other transformers. Thus, the tap setting limit for a speaker can be calculated using the current impedance seen by each speaker and the methods described herein. For example, if four of the same speakers are selected and at the same volume setting, then each speaker would use 25% of the amplifier's supplied power and have the same tap setting limit. However, if each transformer is not set to the same volume setting, the tap setting limit of the speakers will be different. Therefore, the tap setting limit for a speaker can be increased as the volume settings of the other speakers decrease.

Figure 3:
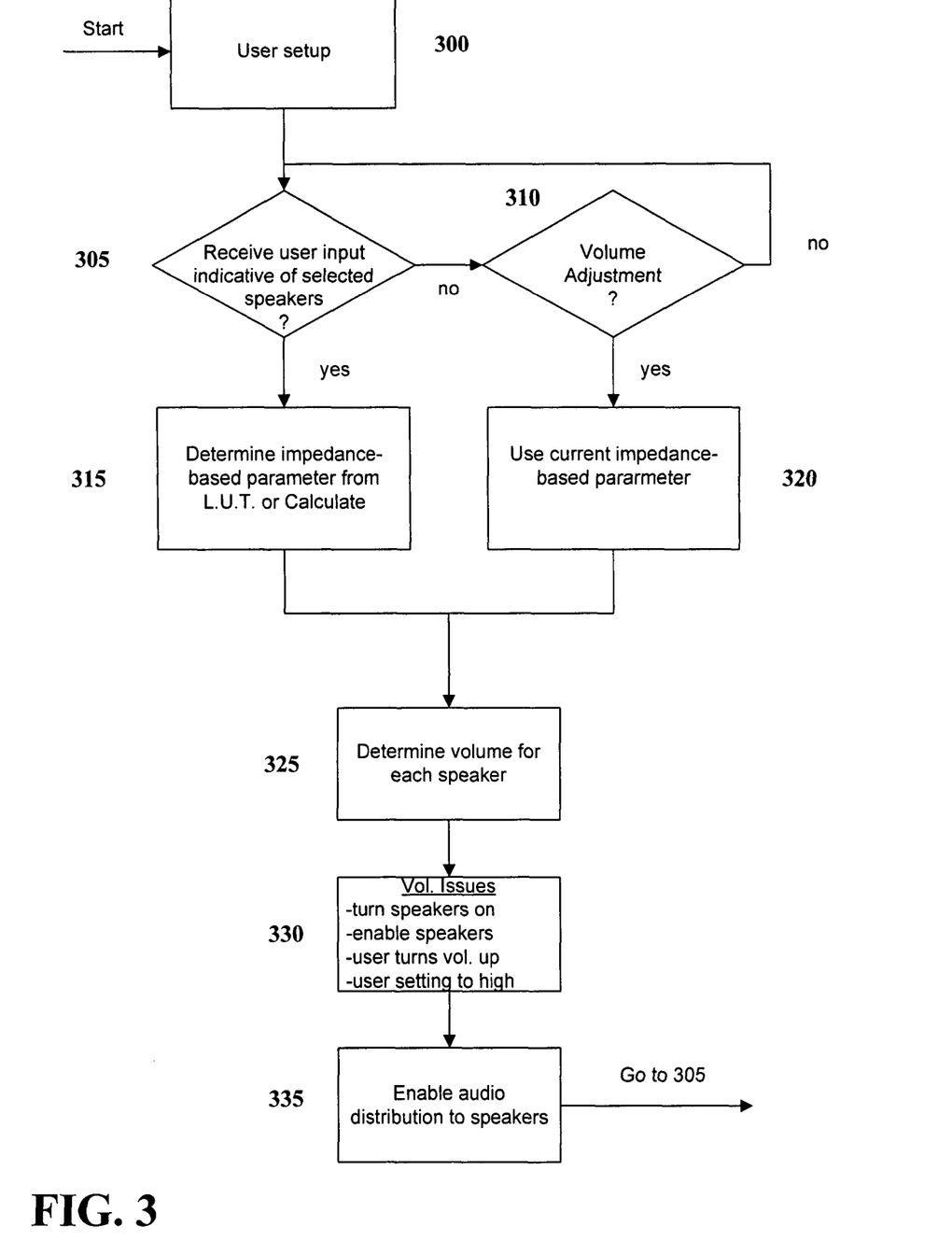
FIG. 3 is a flow chart showing an example method for distributing audio to at least one speaker selected from a set of speakers, according to one embodiment of the present invention.

FIG. 3 depicts a flow chart showing an example method for distributing audio to at least one speaker selected from a set of speakers according to one embodiment of the present invention. The system is initially set up by the user in step 300; in one implementation, setup includes the user providing the target impedance load for the amplifier and the impedance of each speaker connected to the system. The system then waits in step 305 for a user input indicative of at least one speaker being selected from the group of speakers that are connected to the system, and in step 310 for a user input indicating a change in volume for the selected speakers. If a user input indicative of the selection of at least one speaker is received, in step 315 the system determines an impedance-based parameter based on the impedance of each speaker selected by the user and the target impedance load for the amplifier. The impedance-based parameter is determined by retrieving the data from a look-up table or by calculating the parameter using an algorithm as discussed above. If a user input indicating a volume change for the selected speakers is received, in step 320 the system uses the current impedance-based parameter because the number of selected speakers remains the same. The impedance-based parameter is used to determine the tap that each of the autotransformers can be set to without the total impedance load dropping below the target impedance load for the amplifier given the impedance of each speaker selected by the user.

In another example embodiment, the system determines the volume level setting for each speaker in step 325. The system then determines if the volume settings of the speakers would cause any problems in step 330. For example, if the volume level selected by the user is too high and would cause damage to the selected speakers, the highest tap setting of each autotransformer is limited even though a higher tap setting would not violate the target load impendence for the amplifier. In other examples such as when the system is enabled, when the selected speakers are turned on and when the volume of the speakers is turned up, the system adjusts the tap setting of each autotransformer accordingly to prevent damage to the selected speakers. This is accomplished by gradually increasing the amount of power that is sent to each speaker by changing the tap setting of the autotransformers until the desired volume level is achieved. The system prevents damage to the selected speakers by preventing rapid increases in the volume level, such as when a speaker is turned on and the volume level is set to maximum. In step 335, the system enables audio-distribution to the selected speakers by choosing the appropriate tap setting of each of the autotransformers and then returns to step 305 to wait for a user input.

Figure 4:
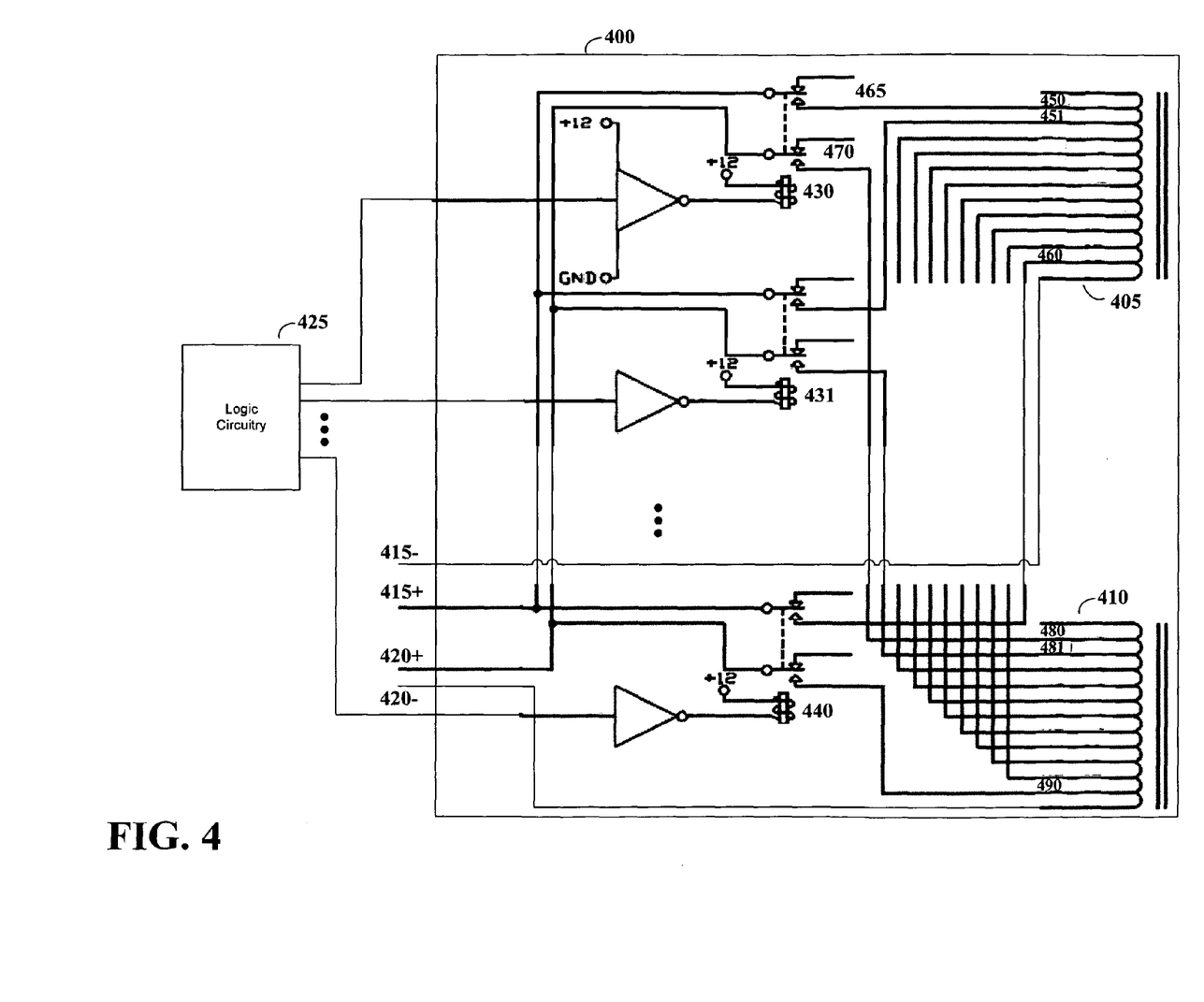
FIG. 4 is schematic diagram of certain modules used in a speaker control system, according to one embodiment of the present invention.

FIG. 4 is schematic diagram of certain modules used in a speaker control system according to another embodiment of the present invention. Audio-distribution circuit 400 includes selectable-tap transformers 405 and 410 which are used to distribute the audio signal to two user selected speakers by way of audio outputs 415+/415− and 420+/420−. The audio signal is connected to the primaries of transformers 405 and 410. Logic circuitry 425 selects the tap settings of transformers 405 and 410. In one implementation, the logic circuitry includes a pick processor, such as PIC16F57 manufactured by Microchip, which is used to select the tap settings of transformers 405 and 410. For simplicity, only relays 430, 431 and 440 are shown, however, in one implementation, audio-distribution circuit 400 includes one relay for each tap setting of the transformer 405. The logic circuitry uses relays 430, 431 and 440, which correspond to tap settings 450, 451 and 460 respectively of the transformer 405 secondary to select one of the tap settings of the transformer secondary. For example, the logic circuitry 425 sends a control signal to relay 430 which induces switch 465 to close, thereby causing tap setting 450 to be selected and the audio signal to be distributed to a selected speaker by way of audio output 415+/415−. Relay 430 also induces switch 470 to close, causing tap setting 480 of transformer 410 to be selected and the audio signal to be distributed to another selected speaker by way of audio output 420+/420−.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention.

What is claimed is:

1. A speaker control system for distribution of an audio signal to at least one speaker selected from a set of speakers, the system comprising:

a set of audio-distribution circuits for distributing the audio signal to the set of speakers; and logic circuitry configured and arranged to receive a signal indicating a selection of the at least one speaker;

determine automatically an impedance-based parameter for use in distributing the audio to the at least one selected speaker based at least partly on a load-tolerance parameter for an audio source, volume settings of other speakers in the set of speakers, and on an impedance of the at least one selected speaker, and control distribution of the audio signal to the at least one selected speaker and therein adjust the impedance, at the audio source, of the at least one selected speaker based, at least partly, on the impedance-based parameter, wherein the audio signal is distributed using one or more of the set of audio-distribution circuits.

2. The system of claim 1, wherein the logic circuitry includes a programmable processor.

3. The system of claim 1, wherein the impedance-based parameter is stored in a look-up table that is accessed by the logic circuitry.

4. The system of claim 1, wherein the logic circuitry includes a programmable processor that automatically determines the impedance-based parameter by executing an algorithm.

5. The system of claim 1, wherein the set of audio-distribution circuits includes a selectable-tap transformer, and wherein the logic circuitry controls distribution of the audio signal by automatically selecting a tap on the selectable-tap transformer based at least partly on the impedance-based parameter.

6. The system of claim 1, further including at least one user volume input indicative of an adjustable volume level, wherein the audio-distribution circuit includes a selectable-tap transformer that is used by the logic circuitry, along with the user volume input and the impedance-based parameter, to control distribution of the audio signal.

7. The system of claim 1, further including an input circuit for receiving a user input indicative of the selection of the at least one speaker.

8. The system of claim 7, wherein the set of speakers includes the at least one selected speaker and other speakers, and where the logic circuitry distributes the audio signal only to the at least one selected speaker.

9. The system of claim 7, wherein the input circuit includes an infrared receiver for receiving the user input.

10. The system of claim 7, wherein the input circuit is adapted to receive the user input from a remote location.

11. For use with a speaker control system, a method of distributing an audio signal to at least one speaker selected from a set of speakers, where each speaker can receive the audio signal from an associated audio-distribution circuit, the method comprising:
    in response to the selection of the at least one speaker from the set of speakers:
        automatically determining, using logic circuitry, based at least partly on the selection, volume settings of other speakers in the set of speakers, a load-tolerance parameter for an audio source and on an impedance of the at least one selected speaker, an impedance-based parameter for use in distributing the audio signal to the at least one selected speaker; and
    controlling distribution of the audio signal to the at least one selected speaker based at least partly on the impedance-based parameter.

12. The method of claim 11, wherein the step of automatically determining includes accessing a look-up table based upon the impedance of the at least one selected speaker.

13. The method of claim 11, wherein the step of controlling the audio signal includes controlling an effective impedance of the at least one selected speaker.

14. The method of claim 11, wherein the step of automatically determining includes performing a calculation that is based upon the impedance of the at least one selected speaker.

15. The method of claim 11, wherein the step of automatically determining is performed dynamically in response to a change in a volume setting for the set of speakers.

16. The method of claim 13, wherein the effective impedance is controlled by selecting a tap setting of a selectable-tap transformer.

17. The method of claim 11, further including the step of adjusting a tap setting in response to at least one user volume input indicative of an adjustable volume level.

18. The method of claim 11, wherein the selection of the at least one speaker provides an indication of whether speakers receive the audio signal.

19. A speaker control system for distribution of an audio signal to a subset of speakers selected from a set of speakers, the system comprising:
    a set of user volume inputs indicative of adjustable volume levels for the set of speakers;
    a set of audio-distribution circuits, including
        selectable-tap transformers for the set of speakers, the selectable-tap transformers configured to control the volume levels of corresponding speakers using current tap settings that correspond to the set of user volume inputs;
        logic circuitry configured to determine automatically a tap setting limit for a particular selectable-tap transformer based upon current tap selections of other selectable-tap transformers and impedance values of speakers corresponding to the other selectable-tap transformers; and
    control circuitry configured to limit the tap setting of the particular selectable-tap transformer in response to the tap setting limit.

20. The system of claim 19, wherein the logic circuitry is configured to determine automatically tap setting limits for the other selectable-tap transformers.

21. The system of claim 19, wherein the logic circuitry is configured to perform the determination in response to an adjustment of a current tap setting for a volume-adjusted selectable-tap transformer and therein limit an impedance at an audio amplifier to a target impedance value while reallocating power of the amplifier such that additional power is available to drive the selected subset of speakers.

22. The system of claim 21, wherein the determination is performed for each selectable-tap transformer other than the volume-adjusted selectable-tap transformer.

23. The system of claim 19, wherein the logic circuitry is configured to determine automatically the tap setting limit using a lookup table.

24. The system of claim 19, wherein the logic circuitry is configured to determine automatically the tap setting limit by executing an algorithm.

25. The system of claim 19, wherein the logic circuitry is configured to determine automatically the tap setting limit dynamically in response to a change in a volume setting for the set of speakers.

* * * * *